(12) United States Patent
Yang et al.

(10) Patent No.: US 8,013,770 B2
(45) Date of Patent: Sep. 6, 2011

(54) DECODER ARCHITECTURE WITH SUB-THERMOMETER CODES FOR DACS

(75) Inventors: Robit Yang, Hsin-Chu (TW); Ying-Chi Hsu, Hsin-Chu (TW); You-Cheng Xiao, Taiping (TW); Wen-Shen Chou, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/331,049

(22) Filed: Dec. 9, 2008

(65) Prior Publication Data

US 2010/0141497 A1   Jun. 10, 2010

(51) Int. Cl.
    *H03M 1/66* (2006.01)
(52) U.S. Cl. ........................................ 341/144; 341/145
(58) Field of Classification Search .................. 341/144, 341/145
    See application file for complete search history.

(56) References Cited

U.S. PATENT DOCUMENTS

| 6,100,833 | A * | 8/2000 | Park ............................... 341/144 |
| 6,346,899 | B1 | 2/2002 | Hadidi |
| 6,909,389 | B1 * | 6/2005 | Hyde et al. .................... 341/144 |

OTHER PUBLICATIONS

Chuchen, L., "10 Bits 100MS/ s Digital Analog Converter for IEEE 802. 11a," National Chiao Tung University, A Thesis for Masters in Electric and Control Engineering, Sep. 2005, 84 pgs.
Tsai, Y.-C., "A CMOS 125 MHz Transmitter for UTP Cable," National Chiao-Tung University, A Thesis for Masters in Electronics Engeneering, Jun. 2002, 106 pgs.

* cited by examiner

*Primary Examiner* — Joseph Lauture
(74) *Attorney, Agent, or Firm* — Slater & Matsil, L.L.P.

(57) ABSTRACT

A digital-to-analog converter (DAC) for converting a digital signal to an analog signal includes a first thermometer decoder and a second thermometer decoder. The first thermometer decoder is configured to decode most-significant bits (MSBs) of the digital signal to generate a first thermometer code. The second thermometer decoder is configured to decode middle bits of the digital signal to generate a second thermometer code. The DAC further includes a plurality of macro cells with each controlled by one bit of the first thermometer code. The plurality of macro cells is configured to provide a first analog signal according to the first thermometer code. The DAC further includes a macro cell configured to provide a second analog signal according to the second thermometer code. The macro cell is further configured to provide a third analog signal according to least-significant bits (LSBs) of the digital signal.

25 Claims, 6 Drawing Sheets

| B2 | B1 | B0 | T6 | T5 | T4 | T3 | T2 | T1 | T0 |
|----|----|----|----|----|----|----|----|----|----|
| 0  | 0  | 0  | 0  | 0  | 0  | 0  | 0  | 0  | 0  |
| 0  | 0  | 1  | 0  | 0  | 0  | 0  | 0  | 0  | 1  |
| 0  | 1  | 0  | 0  | 0  | 0  | 0  | 0  | 1  | 1  |
| 0  | 1  | 1  | 0  | 0  | 0  | 0  | 1  | 1  | 1  |
| 1  | 0  | 0  | 0  | 0  | 0  | 1  | 1  | 1  | 1  |
| 1  | 0  | 1  | 0  | 0  | 1  | 1  | 1  | 1  | 1  |
| 1  | 1  | 0  | 0  | 1  | 1  | 1  | 1  | 1  | 1  |
| 1  | 1  | 1  | 1  | 1  | 1  | 1  | 1  | 1  | 1  |

Fig. 3

| 813 | 84 | 85 | 86 | 87 | 87 | 86 | 85 | 84 |
|-----|----|----|----|----|----|----|----|----|
| 826 | 85 | 84 | 83 | 82 | 82 | 83 | 84 | 85 |
| 821 | 86 | 83 | 4  | 81 | 81 | 4  | 83 | 86 |
| 89  | 87 | 82 | 81 | 1  | 2  | 81 | 82 | 87 |
| 89  | 87 | 82 | 81 | 2  | 1  | 81 | 82 | 87 |
| 821 | 86 | 83 | 4  | 81 | 81 | 4  | 83 | 86 |
| 826 | 85 | 84 | 83 | 82 | 82 | 83 | 84 | 85 |
| 813 | 84 | 85 | 86 | 87 | 87 | 86 | 85 | 84 |

Fig. 4

| 818 | 829 | 820 | 830 | 815 | 824 | 822 | 811 | 811 | 822 | 824 | 815 | 830 | 820 | 829 | 818 |
|---|---|---|---|---|---|---|---|---|---|---|---|---|---|---|---|
| 829 | 818 | 816 | 812 | 828 | 810 | 827 | 819 | 819 | 827 | 810 | 828 | 812 | 816 | 818 | 829 |
| 820 | 816 | 88 | 831 | 825 | 817 | 823 | 814 | 814 | 823 | 817 | 825 | 831 | 88 | 816 | 820 |
| 830 | 812 | 831 | 88 | 813 | 826 | 821 | 89 | 89 | 821 | 826 | 813 | 88 | 831 | 812 | 830 |
| 815 | 828 | 825 | 813 | 84 | 85 | 86 | 87 | 87 | 86 | 85 | 84 | 813 | 825 | 828 | 815 |
| 824 | 810 | 817 | 826 | 85 | 84 | 83 | 82 | 82 | 83 | 84 | 85 | 826 | 817 | 810 | 824 |
| 822 | 827 | 823 | 821 | 86 | 83 | 4 | 81 | 81 | 4 | 83 | 86 | 821 | 823 | 827 | 822 |
| 811 | 819 | 814 | 89 | 87 | 82 | 81 | 1 | 2 | 81 | 82 | 87 | 89 | 814 | 819 | 811 |
| 811 | 819 | 814 | 89 | 87 | 82 | 81 | 2 | 1 | 81 | 82 | 87 | 89 | 814 | 819 | 811 |
| 822 | 827 | 823 | 821 | 86 | 83 | 4 | 81 | 81 | 4 | 83 | 86 | 821 | 823 | 827 | 822 |
| 824 | 810 | 817 | 826 | 85 | 84 | 83 | 82 | 82 | 83 | 84 | 85 | 826 | 817 | 810 | 824 |
| 815 | 828 | 825 | 813 | 84 | 85 | 86 | 87 | 87 | 86 | 85 | 84 | 813 | 825 | 828 | 815 |
| 830 | 812 | 831 | 88 | 813 | 826 | 821 | 89 | 89 | 821 | 826 | 813 | 88 | 831 | 812 | 830 |
| 820 | 816 | 88 | 831 | 825 | 817 | 823 | 814 | 814 | 823 | 817 | 825 | 831 | 88 | 816 | 820 |
| 829 | 818 | 816 | 812 | 828 | 810 | 827 | 819 | 819 | 827 | 810 | 828 | 812 | 816 | 818 | 829 |
| 818 | 829 | 820 | 830 | 815 | 824 | 822 | 811 | 811 | 822 | 824 | 815 | 830 | 820 | 829 | 818 |

DECODER ARCHITECTURE WITH SUB-THERMOMETER CODES FOR DACS

TECHNICAL FIELD

This invention relates generally to digital-to-analog converters, and more specifically to digital-to-analog converters with thermometers and sub-thermometers.

BACKGROUND

Data converters, both digital-to-analog converters (DACs) and analog-to-digital converters (ADCs), are ubiquitous in applications involving digital signal processing of real-world signals such as those found in communication systems, instrumentation, and audio and video processing systems.

Two major issues for DAC design are monotonicity and resolution. Monotonicity means that as the digital value becomes greater, the converted analog value must also become greater. Many DAC building blocks require guaranteed monotonicity with moderate clock rate and moderate design complexity. Examples include a DAC in a digitally controlled oscillator within the PLL loop, or a DAC in a digitally controlled crystal oscillator in an automatic frequency control loop. The matching between different DAC elements is usually required to guarantee monotonic behavior. With the scaling down of integrated circuit manufacturing processes, the physical sizes of the DAC elements become smaller, and it is therefore more difficult to control the sizes of DAC elements, which must be matched to achieve monotonicity. As a result, the physical sizes of the DAC elements are limited by the matching requirement, thus the DAC does not benefit from the process scaling.

One type of DAC that has guaranteed monotonicity is a thermometer DAC. It is so named because it is similar to a mercury thermometer, where the mercury column always rises to the appropriate temperature and no mercury is present above that temperature. Typically, the input digital signal is binary and the binary code is converted to a thermometer code. The thermometer code is then used to control thermometer elements to generate an analog signal. For a thermometer DAC, elements are all of the same size, so that element matching becomes much simpler than in the binary case. Considering the transfer function, the thermometer converter is monotonic by design, since, when the input value increases, the bits change from 0 to 1 only. The requirement on element matching is also relaxed in the thermometer DAC and the monotonicity is guaranteed.

In conventional DACs, thermometer coding is combined with binary coding to achieve the digital-to-analog conversion for any digital number within the conversion range. For example, for a 12-bit DAC, the 12 bits are divided into 6 most-significant bits (MSBs) and 6 least-significant bits (LSBs). The MSBs are converted to a 63-bit thermometer code, with each bit corresponding to one of the macros. Each of the macros is capable of providing a current corresponding to 64 times a minimum current, wherein the minimum current is the unit representing the LSB. For LSBs, whose corresponding digital numbers being less than 64, binary coding is used for the decoding and the controlling of unit cells. At least six unit cells are needed to provide 1 time, 2 times, 4 times, 8 times, 16 times, and 32 times the minimum current. With the different combination of the currents of the six unit cells, any LSB number can be represented.

In the conventional DACs, the unit cells may need to provide relatively greater currents. In the above-discussed case, for example, the maximum current needs to be provided by a single unit cell 32 times the minimum current. This requires the corresponding unit cell to occupy a relatively large chip area. Accordingly, it is difficult to achieve gradient variation matching within the unit cell. If the DACs have 14 bits, at least eight unit cells are needed, which provide 1 time, 2 times, 4 times, 8 times, 16 times, 32 times, 64 times, and 128 times the minimum current. It is thus even more difficult to achieve the gradient variation matching in the unit cell that needs to provide 128 times the minimum current. Therefore, new decoding methods are needed to solve the above-discussed problems.

SUMMARY OF THE INVENTION

In accordance with one aspect of the present invention, a digital-to-analog converter (DAC) for converting a digital signal to an analog signal includes a first thermometer decoder and a second thermometer decoder. The first thermometer decoder is configured to decode most-significant bits (MSBs) of the digital signal to generate a first thermometer code. The second thermometer decoder is configured to decode middle bits of the digital signal to generate a second thermometer code. The DAC further includes a plurality of macro cells, with each controlled by one bit of the first thermometer code. The plurality of macro cells is configured to provide a first analog signal according to the first thermometer code. The DAC further includes a macro cell configured to provide a second analog signal according to the second thermometer code. The macro cell is further configured to provide a third analog signal according to least-significant bits (LSBs) of the digital signal.

In accordance with another aspect of the present invention, a DAC for converting a digital signal to an analog signal includes a first thermometer decoder receiving the digital signal. The first thermometer decoder includes a first plurality of outputs and is configured to decode the MSBs of the digital signal to generate a first thermometer code. The DAC further includes a plurality of macro cells identical to each other, with each coupled to one of the first plurality of outputs; and a second thermometer decoder for receiving the digital signal. The second thermometer decoder includes a second plurality of outputs, and is configured to decode middle bits of the digital signal to generate a second thermometer code. The DAC further includes a macro cell, which includes a first plurality of unit cells configured to be controlled by LSBs of the digital signal and capable of providing currents in a binary style; and a second plurality of unit cells capable of providing identical currents. Each of the second plurality of unit cells is coupled to one of the second plurality of outputs.

In accordance with yet another aspect of the present invention, a method of performing a digital-to-analog conversion includes dividing a digital input signal into MSBs, LSBs, and middle bits; generating a first thermometer code from the MSBs; generating a first combined current from the first thermometer code; generating a second thermometer code from the middle bits; generating a second combined current from the second thermometer code; generating a third combined current from the LSBs using binary decoding; and combining the first combined current, the second combined current, and the third combined current.

The advantageous features of the present invention include reduced variation mismatch due to the use of two thermometer decoders.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates the decoding of the LSBs and the middle bits;

FIG. 4 illustrates an exemplary layout scheme of a micro cell in the 12-bit DAC;

FIG. 8 illustrates an exemplary layout scheme of a macro cell in the 14-bit DAC.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel digital-to-analog converter (DAC) and the corresponding decoding methods are provided. The variations and the operation of the preferred embodiments are discussed. Throughout the various views and illustrative embodiments of the present invention, like reference numbers are used to designate like elements.

In the following discussion, unless specified otherwise, a 12-bit DAC is used as an example to explain the concept of the present invention. As is known in the art, the requirement of converting a digital number (digital signal) to a voltage may be treated as converting the digital number to a current. By allowing the current to flow through a resistor, the current may then be converted to a voltage. Therefore, in the following discussion, the D-A conversion is discussed essentially as converting digit numbers to currents.

Throughout the description, the term "micro cell" represents a cell (for example, an MOS transistor) capable of providing a current representing the least-significant bit (LSB) of the DAC. Accordingly, all micro cells in a DAC preferably have the same size although the size of some of the micro cells may be further reduced, as will be discussed in detail in subsequent paragraphs. The term "macro cell" represents a cell capable of providing a current representing the lowest bit of the most-significant bits (MSBs). In the case, the lowest bit of the MSBs is the seventh bit, a macro cell will represent a current $2^6$, or 64 times the micro-cell current. The term "unit cell," on the other hand, represents a cell formed by connecting multiple micro cells in parallel, and hence can provide a current multiple times the micro-cell current. The unit cells are used as integrated cells, with all micro cells in a unit cell always turned on or off simultaneously. Depending on the number of micro cells included in the unit cells, the unit cells may be denoted as X1 unit cells, X2 unit cells, X4 unit cells, and X8 unit cells, indicating that the corresponding unit cells are capable of providing 1 time, 2 times, 4 times, and 8 times the current of a micro-cell, respectively. For the convenience of discussion, the current provided by a micro cell is referred to as a "current unit" hereinafter.

Figure 1:
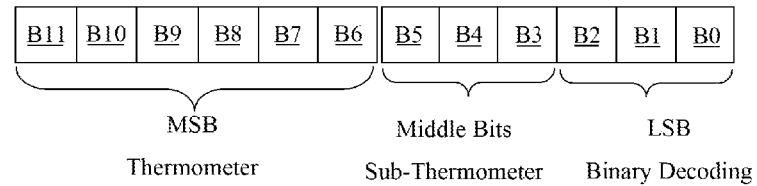
FIG. 1 illustrates how the 12 bits of a 12-bit digital-to-analog converter (DAC) are divided into least-significant bits (LSBs), middle bits, and most-significant bits (MSBs)
Figure 2:
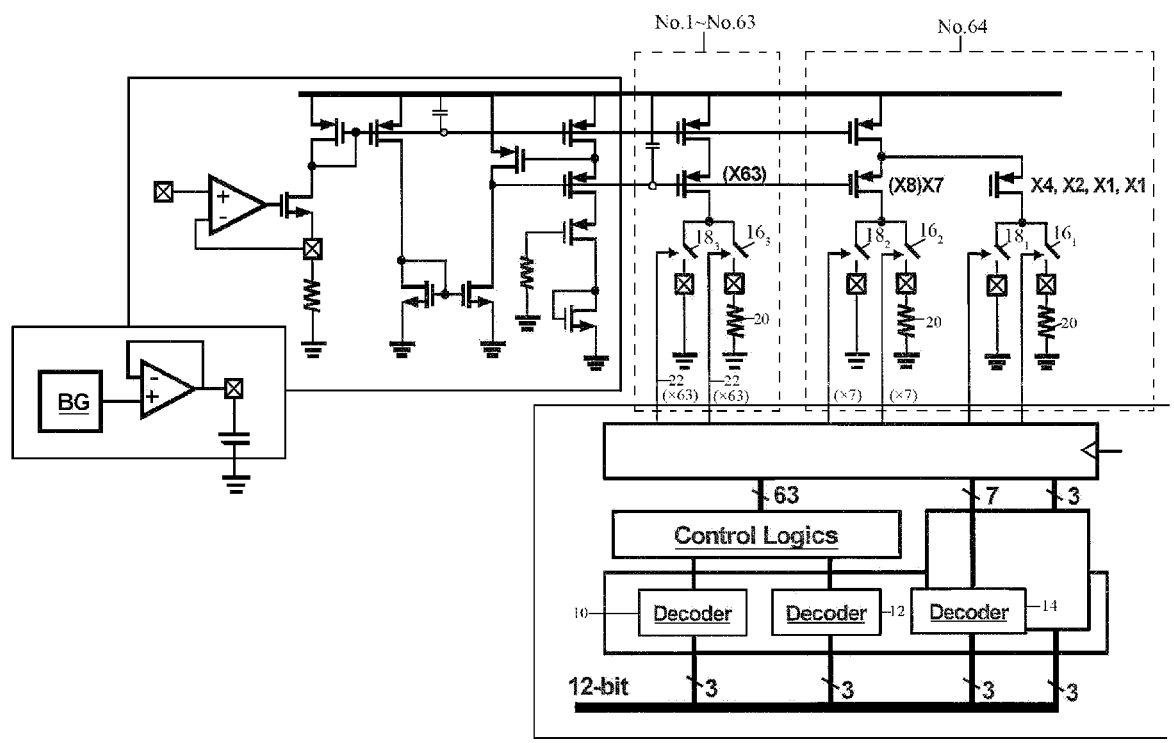
FIG. 2 illustrates a schematic circuit diagram of a 12-bit DAC.

Referring to FIG. 1, the 12 bits of the exemplary 12-bit DAC are divided into three groups, three LSBs, 6 MSBs, and 3 middle bits. As is known in the art, the greatest number that can be represented by a 12-bit DAC is 1023, which corresponds to 1023 current units. The three LSBs and the three middle bits (in combination controls the operation of one macro cell) in combination represent up to 63 current units. In FIG. 2, a macro cell is used to provide the current corresponding to the three LSBs and the three middle bits, and is referred to as No. 64 macro cell. In reality, the No. 64 macro cell is only required to provide up to 63 current units, and if 64 current units or greater are needed, additional macro cells No. 1 through No. 63 are used.

Referring to FIG. 2, macro cells No. 1 through No. 63 are used differently from, and may have different structures than, macro cell No. 64. Each of the macro cells, No. 1 through No. 63, different from macro cell No. 1, is always used as an integrated unit, that is, either turned on to provide 64 current units, or turned off to provide 0 current units. None of the macro cells, No. 1 through No. 63, however, provides any current between 0 current units and 64 current units. Macro cells No. 1 through No. 63 are controlled by 63 thermometer codes generated from the six MSBs (refer to FIG. 1). Accordingly, macro cells No. 1 through No. 63, in combination, can provide any integer current value ranging from 1×64 current units to 63×64 current units. Macro cells No. 1 through No. 64, in combination, can provide any current ranging from 1 current unit to 63×64+63 units, which equals 1023 current units.

Referring again to FIG. 1, the three LSBs, which are by themselves a binary code, are converted to currents in a binary style, which means that a X1 unit cell, a X2 unit cell, and a X4 unit cell are needed to generate currents ranging from one current unit to seven current units by combining these unit cells in appropriate combinations. In addition, a dummy X1 unit cell may be provided, which is not used for generating currents for the D-A conversion. The X1 unit cell, X2 unit cell, X4 unit cell, and the dummy X1 unit cell are inside the No. 64 macro cell (refer to FIG. 2, as symbolized by a transistor denoted as "X4, X2, X1, X1").

Apparently, the X1 unit cell, X2 unit cell, and X4 unit cell in combination can only provide up to 7 current units. Additional unit cells are needed to make up to 63 current units, as required from the No. 64 macro cell. This is achieved by adding seven X8 unit cells, as symbolized by the (X8)X7 transistor, wherein each of the X8 unit cells includes eight micro cells connected in parallel, and hence can provide eight current units. The states (on or off) of the seven X8 unit cells are controlled by the three middle bits (refer to FIG. 1), which are decoded by a sub-thermometer to generate seven different thermometer codes, namely T0 through T6. FIG. 3 illustrates the generated thermometer code, wherein T6 means that only one of the seven X8 unit cells is turned on, while T0 means that all seven of the seven X8 unit cells are turned on. Seven X8 unit cells, when all turned on, will provide 56 current units. Combined with the seven current units provided by the three LSBs, 63 current units can be provided by the No. 64 macro cell.

In the embodiments of the present invention, the implement of the No. 64 macro cell itself adopts the combination of binary decoding (for the three LSBs), and thermometer decoding (for the three middle bits). Therefore, the embodiments of the present invention adopt a (thermometer+thermometer+binary) structure, as shown in FIG. 1. This is different from the conventional decoding scheme, in which the binary coding is used to decode an entirety of six LSBs, and X1, X2, X4, X8, X16, and X32 unit cells are used to provide all current values up to 63 current units. Therefore, the conventional DACs adopted a (thermometer+binary) structure. In the embodiments of the present invention, the X8 unit cell is the largest unit cell in the No. 64 macro cell. Advantageously, the X8 unit cell, which is quite small, results in the decrease in gradient variation mismatch, and hence the accuracy of the DAC can be improved. Further details for improving the accuracy of the DAC are discussed in detail in subsequent paragraphs.

FIG. 2 schematically illustrates the block diagram of a DAC embodiment of the present invention. It shows that the 12 bits of the digital signal are divided into the LSBs, middle bits, and six MSBs (marked as two of the "3" bits). In an embodiment of the present invention, thermometer decoders 10, 12, and 14 may be identical thermometer decoders for generating thermometer codes. The coding generated by thermometer decoders 10 and 12 is used to further generate (by the control logics) 63 thermometer code outputs (marked as X63 to indicate that there are 63 outputs). In this case, decoders 10 and 12 and the control logics, in combination, act as a decoder. The outputs of the control logics control the state of macro cells No. 1 through No. 63. Lines 22, which are marked by (X63), represent 63 pairs of lines, with each pair being connected to one pair of switches 16/18. Switches 16/18 (denoted as $16_1$, $18_1$, $16_2$, $18_2$, $16_3$, and $18_3$) further control the operation of the respective one of the macro cells No. 1 through No. 63. Please note that each of the switches $16_3$ and $18_3$ actually represents 63 individual switches. Further, each pair of switches $16_1/18_1$, $16_2/18_2$, and the individual ones (pairs) of switches $16_3/18_3$ can be controlled individually. In FIG. 2, the 63 macro cells, each being capable of providing 64 current units, are symbolized by one macro cell marked as "No. 1~No. 63," although they are actually 63 separate macro cells. In alternative embodiments, instead of using thermometer decoders 10 and 12, a single thermometer decoder is used to generate 63 thermometer codes from the six MSBs.

Decoder 14 decodes the three middle bits (refer to FIG. 1) and generates seven thermometer codes to control seven X8 unit cells. Again, although the seven X8 unit cells are symbolized by one transistor indicated as (X8)X7, it represents seven separate X8 unit cells that can be separately controlled by the thermometer code generated from the three middle bits. Also, the transistor marked as "X4, X2, X1, X1" represents three unit cells (with one additional X1 cell as being the dummy cell not used for generating currents). Each of the three unit cells can be controlled separately by the three LSBs of the digital signal. A plurality of switches 16 and 18 are connected to, and controlled by, the output of the decoders 10, 12, and 14. If a unit cell or a macro cell needs to be turned on, the respective switch 16 is closed so that the current of the unit cell or the macro cell flows to resistor 20, which current is eventually combined with others to generate the final current and then converted to voltage. Conversely, if a unit cell or a macro cell needs to be turned off, the respective switch 18 is closed so that the current of the unit cell or the macro cell flows to the ground without contributing to the final current and voltage. It may be treated that all resistors 20 in all macro cells No. 1 through No. 64 are actually a single resistor, and hence all currents from the macro cells are combined in resistor 20. Resistor 20 thus converts the combined current to voltage.

FIG. 4 illustrates an exemplary distribution scheme for laying out the micro cells in macro cell No. 64 (refer to FIG. 2). Clearly, the accuracy of macro cell No. 64 is critical to the accuracy of the DAC, and hence macro cell No. 64 needs to be carefully laid out to reduce the process, voltage, and temperature (PVT) variations. Each square in FIG. 4 represents a micro cell (with the micro cells providing the same current), and FIG. 4 illustrates the relative positions of the micro cells. The digits in the squares may have one digit or two digits representing the positions of the respective micro cells. Number "1" represents the X1 unit cell as shown in FIG. 2. Number "2" represent the X2 unit cell as shown in FIG. 2, wherein the two micro cells marked as "2" are interconnected to form a X2 unit cell. Similarly, Number "4" represent the X4 unit cell as shown in FIG. 2, wherein the four micro cells marked as "4" are interconnected to form a X4 unit cell. Since there are seven X8 cells in FIG. 2, there are eight "81" cells, with the number 8 indicating that the micro cell belongs to a X8 cell, and the following digit represents the sequence number of the X8 unit cell. The micro cells having the same sequence number belong to the same X8 unit cell. Accordingly, there are eight "81" cells, eight "82" cells . . . , and eight "87" cells. All "8X" micro cells with the same sequence number "X" are connected in parallel to form a X8 unit cell. Advantageously, in the embodiments of the present invention, the micro cells belonging to the same unit cell, for example, "87," are distributed symmetrically with relative to the center of the No. 64 macro cell array. More preferably, for each of the X8 unit cells, their respective micro cells are symmetrical to the center, symmetrical to the X-axis, and/or symmetrical to the Y-axis of the array. Such a layout averages out the PVT variations, and hence the accuracy of macro cell No. 64 is improved.

Figure 5:
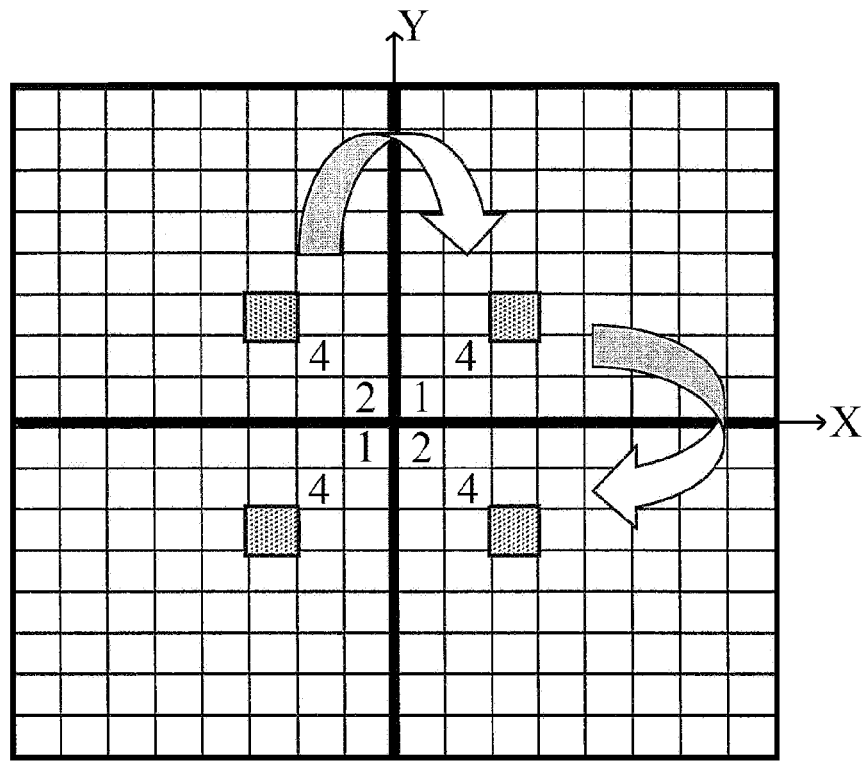
FIG. 5 illustrates a scheme for dividing micro cells into smaller cells.

Further improvement can be made to the layout scheme as shown in FIG. 4, resulting in a layout scheme as shown in FIG. 5. FIG. 5 illustrates four blocks, each being an 8×8 array. The top left block may be identical to FIG. 4, or rearranged as shown in FIG. 5. However, the cells (transistors) in the top left block of FIG. 5 only have ¼ the gate widths of the transistors of the micro cells shown in FIG. 4. Accordingly, each cell (one square) in FIG. 5 can only provide ¼ of the current unit. The top left block of FIG. 5 is mirrored with relative to the Y-axis to produce the top right block, so that the top left block is symmetrical (with relative to the Y-axis) to the top right block. The top left block and the top right block are further mirrored to produce the bottom left block and the bottom right block with relative to the X-axis. Accordingly, all four blocks in FIG. 5 have an identical structure, and are mirrored. The corresponding cells are then interconnected in parallel. For example, all "8X" cells with the same sequence number "X" are interconnected. Since each of the cells in FIG. 5 can only provide ¼ of the current of a micro cell as shown in FIG. 4, the four interconnected mirrored micro-cells will provide the current of one micro cell. By using the layout scheme as shown in FIG. 5, the PVT variation is further reduced.

Figure 6:
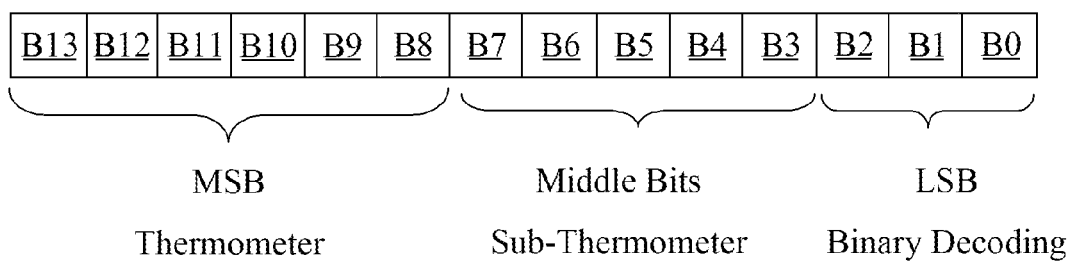
FIG. 6 illustrates how the 14 bits of a 14-bit DAC are divided into LSBs, middle bits, and MSBs.
Figure 7:
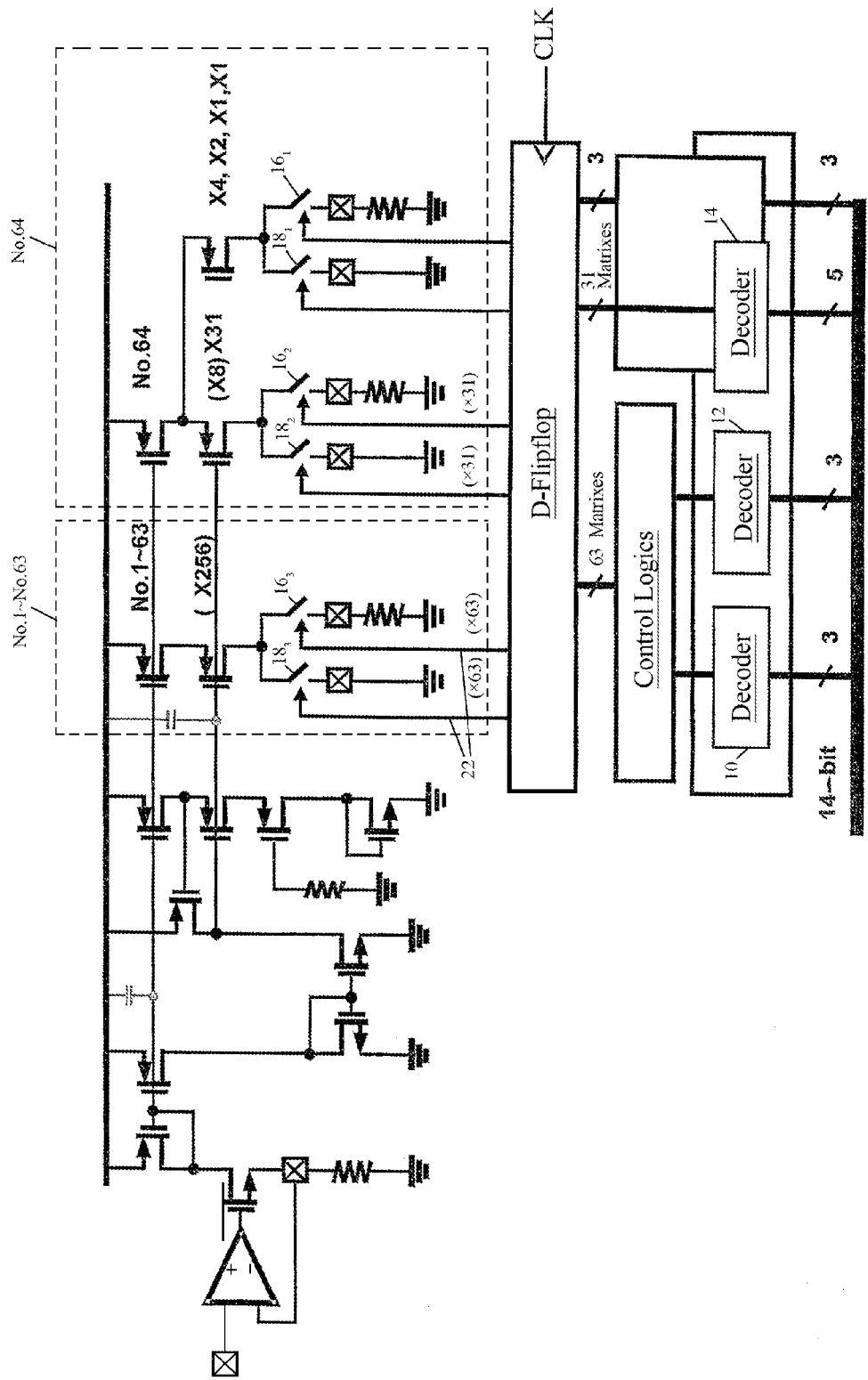
FIG. 7 illustrates a schematic circuit diagram of a 14-bit DAC.

The embodiments of the present invention may be applied to DAC converters having bit numbers different from 12. In an embodiment, if the DAC has a greater or smaller number of bits, the number of middle bits may be modified without modifying the number of MSBs and LSBs. Accordingly, the bits needing to be decoded by the sub-thermometer are changed, while the number of bits needing to be decoded by the thermometer are not changed. For example, FIG. 6 illustrates the allocation of bits in a 14-bit DAC. The LSBs remain to have three bits, and the MSBs remain to have 6 bits. The middle bits now have 5 bits. This is also shown in FIG. 7, which is a block (circuit) diagram of the 14-bit DAC, wherein like elements in FIGS. 2 and 4 are denoted with like elements. Instead of having ($2^3-1$), or seven X8 unit cells, the No. 64 macro cell of the 14-bit DAC needs to have ($2^5-1$), or thirty-one X8 unit cells, which are controlled by the thermometer code generated from the five middle bits (please note decoder 14 in FIG. 7). Similar to the 12-bit DAC as shown in FIG. 2, the 14-bit DAC as shown in FIG. 7 remains to have 64 macro cells, No. 1 through No. 64. However, each of the macro cells, No. 1 through No. 63, should be able to provide 256 current units, while the macro cell No. 64 should provide up to 255 current units, which equals (31×8+7).

FIG. 8 illustrates an exemplary layout of macro cell No. 64 for a 14-bit DAC. Similar to the notation used in FIG. 4, the first digit "8" represents the x8 unit cells, and the following digits (either one digit or two digits) represent the sequence number of the X8 unit cells, wherein the sequence number ranges from 1 to 31. Again, the micro cells belonging to the same unit cell are distributed symmetrically with relative to the center of the No. 64 macro cell. For the X8 unit cells, their respective micro cells are preferably symmetrical to the center, symmetrical to the X-axis, and/or symmetrical to the Y-axis of the No. 64 macro cell array.

In the embodiments discussed in the preceding paragraphs, although the LSBs, the middle bits, and the MSBs are allocated in a (three+three+six) pattern, one skilled in the art will realize that this is merely an example, and different numbers of bits may be allocated to the LSBs, the middle bits, and the MSBs.

Table 1 illustrates the experiment results obtained from the sample DAC embodiments of the present invention.

TABLE 1

| TT | Max (LSB) | Min (LSB) | SS | Max (LSB) | Min (LSB) | FF | Max (LSB) | Min (LSB) |
|---|---|---|---|---|---|---|---|---|
| DNL | 0.351 | −0.234 | DNL | 0.328 | −0.263 | DNL | 0.343 | −0.221 |
| INL | 0.354 | −1.699 | INL | 1.569 | −1.538 | INL | 0.514 | −1.479 |

The symbols "TT," "SS," "FF," represent different process corners corresponding to integrated circuits having different characteristics, for example, the power consumption level and the speed of the integrated circuits. The differential non-linearity (DNL) and integral non-linearity (INL) of the sample DAC are obtained. It is noted that for different process corners, the absolute values of DNLs are well within the range of design specification, that is, DNL<1, and the absolute values of INLs are well within the range of design specification, that is, INL<2.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital-to-analog converter (DAC) for converting a digital signal to an analog signal, the DAC comprising:
a first thermometer decoder receiving the digital signal, the first thermometer decoder being configured to decode most-significant bits (MSBs) of the digital signal to generate a first thermometer code;
a plurality of macro cells, with each controlled by one bit of the first thermometer code, wherein the plurality of macro cells is configured to provide a first analog signal according to the first thermometer code;
a second thermometer decoder receiving the digital signal, the second thermometer decoder being configured to decode middle bits of the digital signal to generate a second thermometer code; and
a macro cell configured to provide a second analog signal according to the second thermometer code, and configured to provide a third analog signal according to the least-significant bits (LSBs) of the digital signal;
wherein the macro cell comprises a first plurality of unit cells capable of providing currents in a binary style and a second plurality of unit cells capable of providing identical currents, and wherein the first plurality of unit cells is controlled by the LSBs, and the second plurality of unit cells is controlled by the second thermometer code and wherein the first plurality of unit cells comprises an X1 unit cell, an X2 unit cell, an X4 unit cell, and wherein the second plurality of unit cells are X8 unit cells.

2. The DAC of claim 1, wherein a number of the X8 unit cells in the macro cell is no less than seven.

3. The DAC of claim 1, wherein the digital signal comprises 12 bits, and the MSBs comprise six bits, the middle bits comprise three bits, and the LSBs comprise three bits.

4. The DAC of claim 1, wherein the digital signal comprise 14 bits, and the MSBs comprise six bits, the middle bits comprise five bits, and the LSBs comprise three bits.

5. The DAC of claim 1, wherein the macro cell comprises an array of identical micro cells, with the micro cells belonging to a same unit cell and interconnected in parallel being distributed symmetrically to a center of the array.

6. The DAC of claim 5, wherein the micro cells belonging to a same unit cell and interconnected in parallel are further distributed symmetrically to an X-axis and a Y-axis of the array.

7. The DAC of claim 5, wherein the macro cell further comprises an additional array being a mirror of the array, and wherein the micro cells in the array are interconnected in parallel to respective mirrored micro cells in the additional array.

8. The DAC of claim 5, wherein the macro cell further comprises three additional arrays, and wherein each of the arrays and the additional arrays are a mirror of remaining ones of the array and the additional arrays, and wherein respective mirrored micro cells in the array and the additional arrays are interconnected in parallel.

9. A digital-to-analog converter (DAC) for converting a digital signal to an analog signal, the DAC comprising:
a first thermometer decoder receiving the digital signal, the first thermometer decoder being configured to decode most-significant bits (MSBs) of the digital signal to generate a first thermometer code, wherein the first thermometer decoder comprises a first plurality of outputs;

a plurality of macro cells identical to each other, with each coupled to one of the first plurality of outputs;
a second thermometer decoder for receiving the digital signal, the second thermometer decoder being configured to decode middle bits of the digital signal to generate a second thermometer code, wherein the second thermometer decoder comprises a second plurality of outputs; and
a macro cell comprising:
a first plurality of unit cells controlled by least-significant bits (LSBs) of the digital signal and providing currents in a binary style; and
a second plurality of unit cells providing identical currents, wherein each of the second plurality of unit cells is coupled to one of the second plurality of outputs;
wherein the first plurality of unit cells comprises an X1 unit cell, an X2 unit cell, and an X4 unit cell, and wherein the second plurality of unit cells are X8 unit cells.

10. The DAC of claim 9, wherein the identical currents provided by the second plurality of unit cells are greater than currents provided by any of the first plurality of unit cells.

11. The DAC of claim 10, wherein each of the plurality of macro cells is capable of providing a maximum current greater than a maximum current provided by the macro cell.

12. The DAC of claim 9, wherein the plurality of macro cells are configured to provide a first combined current according to the first thermometer code.

13. The DAC of claim 12, wherein the macro cell is configured to provide a second combined current according to the second thermometer code, and configured to provide a third combined current according to the LSBs of the digital signal.

14. The DAC of claim 9, wherein the digital signal comprises 12 bits, and the MSBs comprise six bits, the middle bits comprise three bits, and the LSBs comprise three bits.

15. The DAC of claim 9, wherein the digital signal comprises 14 bits, and the MSBs comprise six bits, the middle bits comprise five bits, and the LSBs comprise three bits.

16. The DAC of claim 9, wherein the macro cell comprises an array of identical micro cells, and wherein the micro cells belonging to a same unit cell and interconnected in parallel are distributed symmetrically to a center of the array.

17. The DAC of claim 16, wherein the micro cells belonging to a same unit cell and interconnected in parallel are further distributed symmetrically to an X-axis and a Y-axis of the array.

18. The DAC of claim 16, wherein the macro cell further comprises an additional array being a mirror of the array, and wherein the micro cells in the array are interconnected in parallel to respective mirrored micro cells in the additional array.

19. The DAC of claim 16, wherein the macro cell further comprises three additional arrays, wherein each of the array and the additional arrays is a mirror of remaining ones of the array and the additional arrays, and wherein respective mirrored micro cells in the array and the additional arrays are interconnected in parallel.

20. The DAC of claim 9, wherein each of the plurality of identical macro cells has a structure different from the macro cell.

21. A method of performing a digital-to-analog conversion (DAC), the method comprising:
dividing a digital input signal into most-significant bits (MSBs), least-significant bits (LSBs), and middle bits;
generating a first thermometer code from the MSBs;
generating a first combined current from the first thermometer code;
generating a second thermometer code from the middle bits;
generating a second combined current from the second thermometer code;
generating a third combined current from the LSBs using binary decoding; and
combining the first combined current, the second combined current, and the third combined current;
wherein the step of generating the third combined current from the LSBs comprises using the LSBs to control the state of a plurality of binary unit cells, wherein a number of the binary unit cells is equal to a number of the LSBs, and wherein the step of generating the second combined current and the step of generating the third combined current are performed using a same macro cell and the macro cell comprises an X1 unit cell, an X2 unit cell, an X4 unit cell, and a plurality of additional unit cells capable of providing a same number of current units, and wherein the X1 unit cell, the X2 unit cell, the X4 unit cell, and the plurality of additional unit cells are laid out in an array, with micro cells in each of the X2 unit cell, the X4 unit cell, and the plurality of additional unit cells laid out symmetrically relative to a center of the array.

22. The method of claim 21, wherein the first thermometer code is used to control a plurality of macro cells, and wherein each of the plurality of macro cells has a structure identical to other ones of the plurality of macro cells.

23. The method of claim 21, wherein the micro cells belonging to a same one of the additional unit cells are laid out symmetrically with relative to an X-axis and a Y-axis of the array.

24. The method of claim 21 further comprising:
reducing a size of the micro cells in the macro cell;
mirroring the array to form an additional array; and
connecting the micro cells in the array to respective mirrored micro cells in the additional array.

25. The method of claim 21 further comprising combining the first combined current, the second combined current, and the third combined current.

* * * * *